United States Patent
Suzuki et al.

(10) Patent No.: US 9,225,287 B2
(45) Date of Patent: Dec. 29, 2015

(54) OSCILLATOR, RECTIFIER, AND TRANSCEIVER DEVICE

(71) Applicant: TDK CORPORATION, Tokyo (JP)

(72) Inventors: Eiji Suzuki, Tokyo (JP); Tsuyoshi Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 127 days.

(21) Appl. No.: 14/256,546

(22) Filed: Apr. 18, 2014

(65) Prior Publication Data

US 2014/0315498 A1  Oct. 23, 2014

(30) Foreign Application Priority Data

Apr. 18, 2013 (JP) ................................ 2013-087514

(51) Int. Cl.
*H03B 15/00* (2006.01)
*H03D 1/00* (2006.01)

(52) U.S. Cl.
CPC ............... *H03D 1/00* (2013.01); *H03B 15/006* (2013.01)

(58) Field of Classification Search
CPC .................................................... H03B 15/006
See application file for complete search history.

(56) References Cited

U.S. PATENT DOCUMENTS

| 7,504,898 | B2 | 3/2009 | Fukuzawa et al. | |
|---|---|---|---|---|
| 7,589,600 | B2 | 9/2009 | Dimitrov et al. | |
| 7,808,330 | B2 | 10/2010 | Fukuzawa et al. | |
| 2007/0109147 | A1* | 5/2007 | Fukuzawa | B82Y 25/00 340/903 |
| 2007/0236105 | A1* | 10/2007 | Mancoff | H01L 43/08 310/363 |
| 2008/0129401 | A1* | 6/2008 | Fukuzawa | B82Y 25/00 331/157 |
| 2008/0150640 | A1* | 6/2008 | Dimitrov | H03B 15/006 331/3 |
| 2010/0039181 | A1* | 2/2010 | Firastrau | B82Y 25/00 313/94.1 |
| 2015/0085569 | A1* | 3/2015 | Nozaki | H01L 29/66984 365/158 |
| 2015/0109062 | A1* | 4/2015 | Suzuki | H03B 15/006 331/107 R |
| 2015/0109063 | A1* | 4/2015 | Suzuki | H03B 15/006 331/107 R |

FOREIGN PATENT DOCUMENTS

JP   A-2007-124340   5/2007

* cited by examiner

*Primary Examiner* — David Bilodeau
(74) *Attorney, Agent, or Firm* — Oliff PLC

(57) ABSTRACT

An oscillator has an oscillation portion that generates oscillatory electric signals due to a magnetization motion; and a first electric circuit that is connected in parallel to the oscillation portion. A current whose magnitude oscillates flows to the first electric circuit, and the first electric circuit is arranged such that a magnetic field generated by the current is applied to the oscillation portion.

20 Claims, 11 Drawing Sheets

OSCILLATOR, RECTIFIER, AND TRANSCEIVER DEVICE

BACKGROUND

This invention relates to an oscillator, a rectifier, and a transceiver device.

In recent years, microwave oscillation and receiving by a magnetoresistive effect element has been studied. For example, Patent Reference 1 discloses that when a direct current and a magnetic field are applied to a CCP-CPP (Current Confined Path-Current Perpendicular to Plane) oscillation element, the CCP-CPP oscillation element oscillates.

PRIOR ART REFERENCE

Patent Reference

[Patent Reference 1] Japanese Published Patent Application P2007-124340A

SUMMARY

Problem to be Resolved by the Invention

However, at present, it cannot be said that output stability of microwave oscillation and receiving of a magnetoresistive effect element is sufficient. As described later, oscillation and receiving result from a magnetization motion within a magnetic film comprising a magnetoresistive effect element. Thus, a countermeasure is needed that is fundamentally different from the many conventional technologies that stabilize an electric circuit.

This invention reflects on the above-mentioned problem and has an object of providing an oscillator or a rectifier that can improve output stability of microwave oscillation and receiving of a magnetoresistive effect element. Additionally, another object is to provide a transceiver device that can improve output stability of microwave oscillation and receiving of a magnetoresistive effect element by having such an oscillator and rectifier.

In order to accomplish the above-mentioned object, in the oscillator related to a first mode of this invention, an oscillation portion that generates oscillatory electric signals due to magnetization motion and a first electric circuit that is connected in parallel to the oscillation portion are provided. A current whose magnitude oscillates flows to the first electric circuit, and the first electric circuit is arranged such that a magnetic field generated by the current is applied to the oscillation portion. By the oscillator related to this first mode, output stability of microwave oscillation and receiving of a magnetoresistive effect element can be improved.

Additionally, in the oscillator related to a second mode of this invention, it is preferable that the oscillation portion is a magnetoresistive effect element.

Furthermore, in the oscillator related to a third mode of this invention, it is preferable that, in the oscillator related to the first or second mode, the first electric circuit has a loop portion, and the loop portion is arranged such that the magnetic field generated by a current flowing through the loop portion is applied to the oscillation portion.

Furthermore, in the oscillator related to a fourth mode of this invention, in the oscillator related to any of the first to third modes, an oscillation frequency of the oscillation portion and a resonance frequency of the first electric circuit are equal to each other.

Furthermore, in the oscillator related to a fifth mode of this invention, in the oscillator related to any of the first to third modes, the oscillation frequency of the oscillation portion and the resonance frequency of the first electric circuit are different from each other.

In a rectifier related to a sixth mode of this invention, a rectifying portion that manifests a rectifying action due to magnetization motion and a first electric circuit that is connected in parallel to the rectifying portion are provided. A current whose magnitude oscillates flows to the first electric circuit, and the first electric circuit is arranged such that the magnetic field generated by the current is applied to the rectifying portion.

Furthermore, in a rectifier related to a seventh mode of this invention, it is preferable that the rectifying portion is a magnetoresistive effect element.

Furthermore, in a rectifier related to an eighth mode of this invention, it is preferable that, in the rectifier related to the sixth or seventh mode, the first electric circuit has a loop portion, and the loop portion is arranged such that the magnetic field generated by a current flowing through the loop portion is applied to the rectifying portion.

Furthermore, in a rectifier related to a ninth mode of this invention, it is preferable that, in the rectifier related to any of the sixth to eighth modes, a rectifying frequency of the rectifying portion and the resonance frequency of the first electric circuit are equal to each other.

Furthermore, in a rectifier related to a tenth mode of this invention, it is preferable that, in the rectifier related to any of the sixth to eighth modes, the rectifying frequency of the rectifying portion and the resonance frequency of the first electric circuit are different from each other.

In a transceiver device related to an eleventh mode of this invention, there are provided:

the oscillator as set forth in any of the first to fifth modes; and the rectifier as set forth in any of the sixth to tenth modes, wherein wireless communication or wireless power transmission is performed by electromagnetically coupling the first electric circuit of the oscillator and the first electric circuit of the rectifier.

This invention was made in view of the above-mentioned problem, and can provide an oscillator and a rectifier that can improve output stability of microwave oscillation and receiving of a magnetoresistive effect element. Additionally, this invention can also provide a transceiver device that can improve output stability of microwave oscillation and receiving of a magnetoresistive effect element by using such an oscillator and rectifier.

DETAILED DESCRIPTION OF EMBODIMENTS

The following explains examples of modes that implement this invention, using the drawings. The following explanation gives examples of some of the embodiments of this invention. This invention is not limited to these embodiments, and as long as a mode has a technical concept of this invention, it is included in the scope of this invention. Each structure of each mode, and combinations thereof, are examples, and structural additions, structural omissions, structural substitutes, and other modifications are possible without departing from the point(s) of this invention.

(Embodiment 1)

Figure 1:
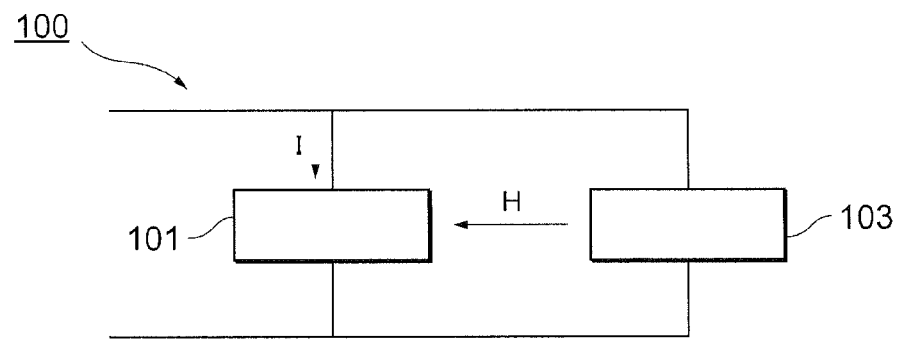
FIG. 1 is a schematic view of an oscillator related to embodiment 1 of this invention.

FIG. 1 is a diagram showing an oscillator 100 related to embodiment 1. The oscillator 100 of embodiment 1 is provided with an oscillation portion 101 and a first electric circuit 103 connected in parallel to the oscillation portion 101.

When a direct current is caused to flow to the oscillator 100, the oscillation portion 101 oscillates due to the direct current I. The current due to the oscillation output of the oscillation portion 101, or a current in which the current due to the oscillation output is overlapped with a direct current, flows to the first electric circuit 103. Due to the current, the first electric circuit 103 generates an oscillating magnetic field H having a frequency component that is equal to the oscillation of the oscillation portion 101. The first electric circuit 103 is arranged such that the oscillating magnetic field H is fed back to the oscillation portion 101. Arrow H shows the oscillating magnetic field that is fed back to the oscillation portion 101 and is generated by the first electric circuit 103. Here, the oscillating magnetic field refers to a magnetic field that is not a static magnetic field, such as a magnetic field that is oscillated as a direction changes at 180 degrees such as an alternating magnetic field, a magnetic field in which a magnetic field component whose magnitude oscillates is overlapped with a static magnetic field component, a magnetic field in which a direction rotates like a rotational magnetic field, or the like.

Because the oscillating magnetic field H having a frequency component equal to the oscillation frequency of the oscillation portion 101 is fed back to the oscillation portion 101, the output stability of the oscillator improves.

In order to make the oscillating magnetic field H of the feedback be in phase with the oscillation, it is desirable that the oscillation portion 101 and the first electric circuit 103 are arranged at a distance of a wavelength or less, which is determined by the frequency.

Some examples of the oscillation portion 101 are (i) an oscillation portion that oscillates only due to application of the direct current I and (ii) an oscillation portion that oscillates due also to application of a magnetic field with a threshold value or more. Here, the magnetic field with a threshold value refers to a magnitude of the minimum magnetic field that is needed for the oscillation portion 101 to oscillate when the direct current is supplied to the oscillation portion 101.

Among oscillation portions that do not oscillate due to a current only, in order to cause oscillation of an oscillation portion in which a magnetic field with a threshold value is larger than zero, (a) the direct current I and (b) a magnetic field whose magnitude is larger than zero need to be applied to the oscillation portion 101. If an oscillation portion 101 is used that does not oscillate due to the direct current I only, a magnetic field with terrestrial magnetism or more is applied. Incidentally, terrestrial magnetism here refers to geomagnetism that acts on an oscillator. For example, geomagnetism on the surface of the earth is 37 A/m, as an approximation.

A magnetic field applying means that applies a magnetic field having a threshold value or more is not limited to a magnet. For example, a magnetic field generated by current flowing into a wire, a coil, or an electromagnet can be used.

Figure 2:
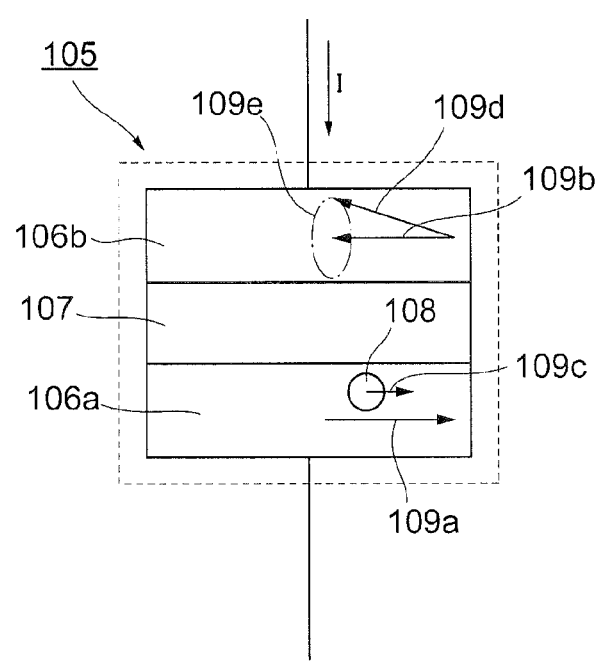
FIG. 2 is a diagram showing a structural example of a magnetoresistive effect element related to an embodiment of this invention.

The oscillation portion 101 is not particularly limited, but, for example, a magnetoresistive effect element can be used. FIG. 2 shows a structural example of a magnetoresistive effect element. A magnetoresistive effect element 105 is provided with (i) a pin layer 106a that is a magnetic layer, (ii) a free layer 106b that is a magnetic layer, and (iii) a spacer layer 107 that is arranged therebetween. A magnetization direction of the pin layer 106a is fixed, and arrow 109a shows the fixed magnetization direction of the pin layer 106a. The magnetization direction of the free layer 106b faces a direction of an effective magnetic field in a state prior to applying a current. Arrow 109b shows the direction of the effective magnetic field. An effective magnetic field is a sum of an anisotropic magnetic field generated within the free layer 106b, an alternating magnetic field, an external magnetic field, and a demagnetizing field. In FIG. 2, the magnetization direction of the pin layer 106a and the direction of the effective magnetic field of the free layer 106b face directions opposite to each other, but directions are not limited to this.

The magnetoresistive effect element 105 is not particularly limited, but for example, a GMR element, a TMR element, a magnetoresistive effect element in which a current constriction path exists in an insulating layer of the spacer layer 107, or the like can be used.

When a GMR element is used for the magnetoresistive effect element 105, the spacer layer 107 can use a non-magnetic metal, for example, bronze or the like. For materials for the free layer 106b and the pin layer 106a of the GMR element, for example, magnetic metal such as cobalt, iron, nickel, chrome, and alloys thereof, or an alloy in which boron is mixed with a magnetic alloy can be used. In order to fix magnetization of the pin layer 106a, exchange coupling with an antiferromagnetic layer comprising an alloy such as iridium, iron, platinum, manganese, or the like, or antiferromagnetic coupling through a magnetic metal multilayer film (for example, a multilayer film of cobalt iron-ruthenium-cobalt iron) can be used. Furthermore, it is preferable that a thickness of each layer is in a range of from approximately 0.1 nm to approximately 50 nm. As for the GMR element, because the spacer layer 107 is constituted by metal, the resistance value is lower than that of other magnetoresistive effect elements. Because of this, when the magnetoresistive effect element 105 is connected to a circuit with low impedance, it is preferable in view of impedance matching.

When a TMR element is used for the magnetoresistive effect element 105, the spacer 107 can use an insulating layer of, for example, aluminum or magnesium oxide (MgO). For materials for the free layer 106b and the pin layer 106a of the TMR element, for example, magnetic metal such as cobalt, iron, nickel, chrome, and alloys thereof, or an alloy in which boron is mixed with a magnetic alloy can be used. In order to fix magnetization of the pin layer 106a, exchange coupling with an antiferromagnetic layer comprising an alloy such as iridium, iron, platinum, manganese, or the like, or antiferromagnetic coupling through a magnetic metal multilayer film (for example, a multilayer film of cobalt iron-ruthenium-cobalt iron) can be used. Furthermore, it is preferable that a thickness of each layer is in a range of from approximately 0.1 nm to approximately 50 nm. As for the TMR element, because the spacer layer 107 is constituted by an insulating film, the resistance value is higher than that of other magnetoresistive effect elements. Because of this, when the magnetoresistive effect element 105 is connected to a circuit with high impedance, it is preferable in view of impedance matching.

Additionally, if a magnetoresistive effect element that has a current constriction path in the insulating layer of the spacer layer 107 is used for the magnetoresistive effect element 105, the insulating layer of the spacer layer 107 is constituted by $Al_2O_3$ or the like. For the current constriction path of the spacer layer 107, for example, non-magnetic metal such as bronze, magnetic metal such as cobalt, iron, nickel, chrome, and alloys thereof, or a magnetic metal in which boron is mixed with a magnetic alloy can be used. For a magnetization free layer and a magnetization fixing layer of the magnetoresistive effect element 105, for example, magnetic metal such as cobalt, iron, nickel, chrome, and alloys thereof, or an alloy in which boron is mixed with a magnetic alloy can be used. In order to fix magnetization of the pin layer 106a, exchange coupling with an antiferromagnetic layer comprising an alloy such as iridium, iron, platinum, manganese, or the like, or antiferromagnetic coupling through a magnetic metal multilayer film (for example, a multilayer film of cobalt iron-ruthenium-cobalt iron) can be used. Furthermore, it is preferable that a thickness of each layer is in a range of from approximately 0.1 nm to approximately 50 nm. This magnetoresistive effect element 105 has a current constriction path and improves a current density by the current constriction path. Because of this, a current that flows to the element can be made smaller than that of other magnetoresistive effect elements. By using this magnetoresistive effect element 105 in the oscillation portion 101, a circuit can be made in which electricity consumption is suppressed.

Self-oscillation of the magnetoresistive effect element 105 related to this embodiment will be explained. Here, self-oscillation is a phenomenon in which electrical oscillation is excited by a direct current that is not oscillating. When a direct current I flows to the magnetoresistive effect element 105, a conduction electron 108 flows in a direction counter to the direction of the direct current I, that is, from the pin layer 106a to the free layer 106b via the spacer layer 107. In the pin layer 106a, which is magnetized in the direction of the arrow 109a, the spin of the conduction electron 108 is polarized in the direction of the arrow 109a. The arrow 109c shows a direction of the spin of the conduction electron 108. By the spin-polarized electron 108 flowing into the free layer 106b via the spacer layer 107, the free layer 106b is magnetized and an angular momentum is imparted. By so doing, an action is applied that tries to incline the direction of magnetization of the free layer 106b from the direction of the arrow 109b, which shows the direction of the effective magnetic field. Meanwhile, a dumping action is applied that tries to stabilize the direction of the magnetization of the free layer 106b to the direction of the arrow 109b, which shows the direction of the effective magnetic field. Therefore, these two actions balance each other, and the direction of magnetization of the free layer precesses about the direction of the effective magnetic field. This precession is shown as a movement of the arrow 109d, which shows the magnetization direction of the free layer, about the arrow 109b, which shows the direction of the effective magnetic field, and the locus of the precession of the arrow 109d is shown by dashed line 109e. The magnetization direction of the free layer changes at a high frequency with respect to the magnetization direction of the pin layer, so due to the magnetoresistive effect in which resistance changes depending on the relative angle of the magnetization direction of the free layer and the magnetization direction of the pin layer, the resistance value also changes at high frequency. The resistance value with respect to the direct current I changes at a high frequency, so a voltage is generated that oscillates at a high frequency within a range of from approximately 100 MHz to approximately 1 THz. The direction of the effective magnetic field can be not only an angle of 180 degrees, which is a direction opposite to the magnetization direction of the pin layer 106a, but can also be an angle such as 0 degree, which is the same direction as the magnetization direction of the pin layer 106a, or 45 degrees, 90 degrees, or 135 degrees.

The applied magnetic field and the oscillation frequency are substantially proportional to each other. Thus, it is preferable that an external magnetic field is large so as to generate oscillation of a high frequency.

If a magnetoresistive effect element such as those described above is used for the oscillation portion 101, an oscillation magnetic field H having a frequency component that is equal to a frequency of a periodic motion is fed back to the periodic motion of magnetization that is a source of oscillation. Thus, the periodic motion of magnetization becomes stable, and output stability of oscillation effectively improves.

Figure 3:
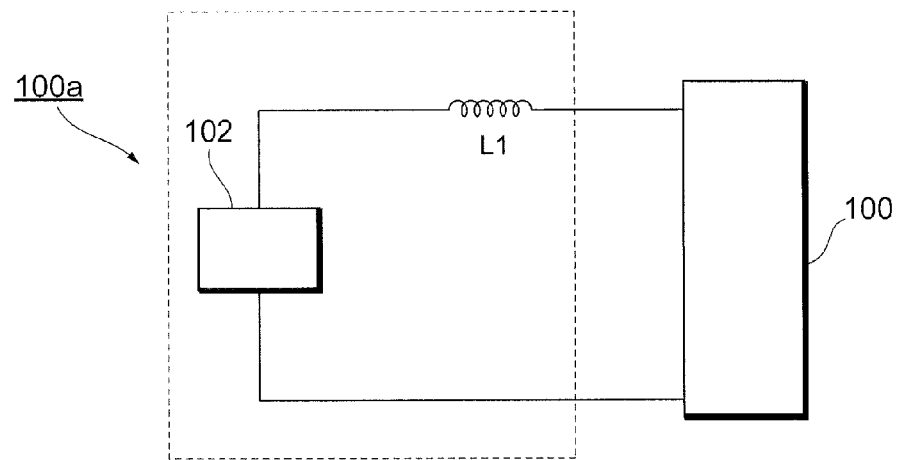
FIG. 3 is a diagram showing a peripheral circuit of the oscillator related to embodiment 1 of this invention.

FIG. 3 is a diagram showing an example of a peripheral circuit using the oscillator 100 related to embodiment 1. A peripheral circuit 100a is provided with a direct current source 102 and an inductor L1. The inductor L1 can suppress high frequency output oscillated by the oscillator 100 from flowing to the direct current source 102.

When a direct current from the direct current source 102 is supplied to the oscillator 100, the oscillator 100 outputs a high frequency. If the first electric circuit 103 is provided with a function, for example, an antenna, that radiates an electric power to outside, the first electric circuit 103 radiates part of the electric power, which has been supplied from the direct current source 102, to outside.

Figure 4:
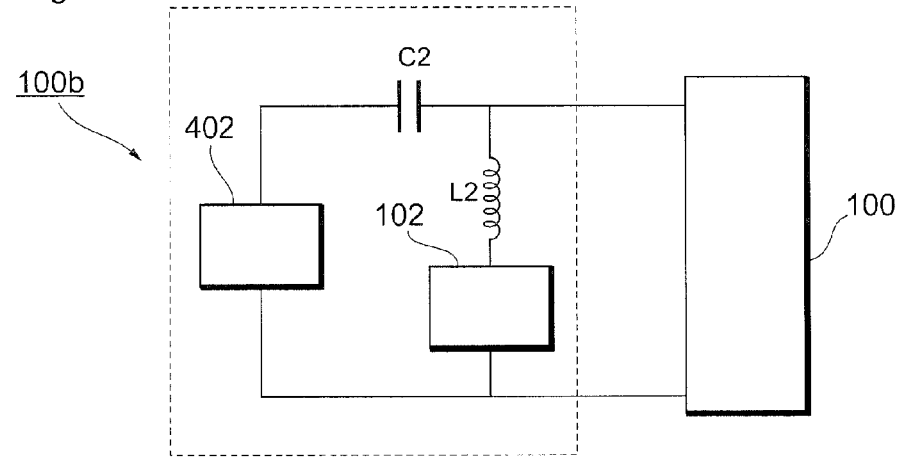
FIG. 4 is a diagram showing a peripheral circuit of the oscillator related to embodiment 1 of this invention.

FIG. 4 is a diagram showing another example of a peripheral circuit using the oscillator 100 related to embodiment 1. A peripheral circuit 100b is constituted by a direct current source 02, a load 402, an inductor L2, and a capacitor C2. The inductor L2 can suppress high frequency output oscillated by the oscillator 100 from flowing to the direct current source 102, and the capacitor C2 can suppress a direct current from flowing to the load 402.

When a direct current is supplied from the direct current source 102 to the oscillator 100, the oscillator 100 outputs a high frequency. The high frequency output that has been output by the oscillator 100 is transmitted through the capacitor C2, which has an impedance smaller than that of the inductor L2, and is consumed in the load 402.

A peripheral circuit is omitted from the explanation of the following embodiments.

(Embodiment 2)

Embodiment 2 explains an oscillator that can more effectively feed back an oscillating magnetic field to the oscillation portion.

Embodiment 2 is an embodiment that constitutes a loop portion, which is a magnetic field applying portion, in the first electric circuit 103, such that the first electric circuit 103 can easily generate an oscillating magnetic field, and forms a capacitance at one side of the loop portion. For the capacitance, a direct-current insulated structure, such as a chip part such as a capacitor, a capacitance manufactured by a conductive pattern, a stray capacitance, or the like, can be used.

Figure 5:
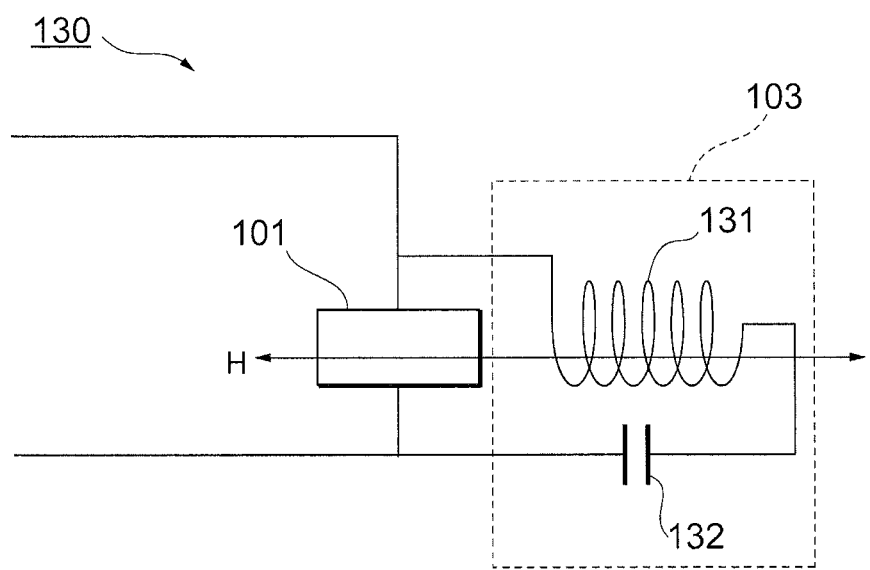
FIG. 5 is a circuit diagram of an oscillator related to embodiment 2 of this invention.

FIG. 5 is a circuit diagram showing the oscillator of embodiment 2. An oscillator 130 of embodiment 2 is provided with an oscillation portion 101 and a first electric circuit 103 that is connected in parallel to the oscillation portion 101. The first electric circuit 103 is provided with an inductor 131, which represents a loop portion, and a capacitor 132, which represents a capacitance. Actually the first electric circuit 103 also has a resistance component, which is omitted here.

The loop portion represented by the inductor 131 generates an oscillating magnetic field H from the oscillation output of the oscillation portion 101, and efficiently feeds back the oscillating magnetic field H to the oscillation portion 101. Thus, output stability of the oscillation portion 101 improves.

Because the first electric circuit 103 is constituted by the inductor 131 and the capacitor 132, it has a resonance frequency Fr. Meanwhile, the oscillation portion 101 oscillates at a frequency fr. If the oscillation frequency fr of the oscillation portion and the resonance frequency Fr of the first electric circuit are equal to each other, the first electric circuit 103 resonates at the oscillation frequency fr of the oscillation portion 101, so the oscillating magnetic field of the frequency Fr=fr, which has been generated by the first electric circuit 103, can be more efficiently fed back to the oscillation portion 101. Meanwhile, if the oscillating magnetic field of the feedback is excessively strongly, the magnetization of the free layer 106b is inverted, which suspends oscillation. In such a case, it is preferable that the oscillating magnetic field strength of the feedback is made weak by using a structure in which the oscillation frequency fr of the oscillation portion and the resonance frequency Fr of the first electric circuit are different from each other. Here, the oscillation frequency fr of the oscillation portion and the resonance frequency Fr of the first electric circuit being equal to each other means that the difference between the oscillation frequency fr of the oscillation portion and the resonance frequency Fr of the first electric circuit is 10% or lower than the oscillation frequency fr of the oscillation portion. Additionally, the oscillation frequency fr of the oscillation portion and the resonance frequency Fr of the first electric circuit being different from each other means that the difference between the oscillation frequency fr of the oscillation portion and the resonance frequency Fr of the first electric circuit is more than 10% of the oscillation frequency fr of the oscillation portion.

Additionally, the loop portion of embodiment 2 can also be used as an antenna that discharges oscillated electric power as an electromagnetic field. Thus, if an electromagnetic field is discharged from the oscillator to outside, there is no need for newly arranging an antenna, and the oscillator as a whole can be made smaller. Here, antenna refers to antennas that transmit electromagnetic waves to a distance sufficiently longer than a wavelength, as well as to antennas and/or resonators that transmit electromagnetic fields to a distance that is substantially the same as or shorter than a wavelength.

(Embodiment 3)

For embodiment 2, it was explained that a loop portion is formed in the first electric circuit 103, but arrangement of the loop portion is explained in embodiment 3.

Figure 6:
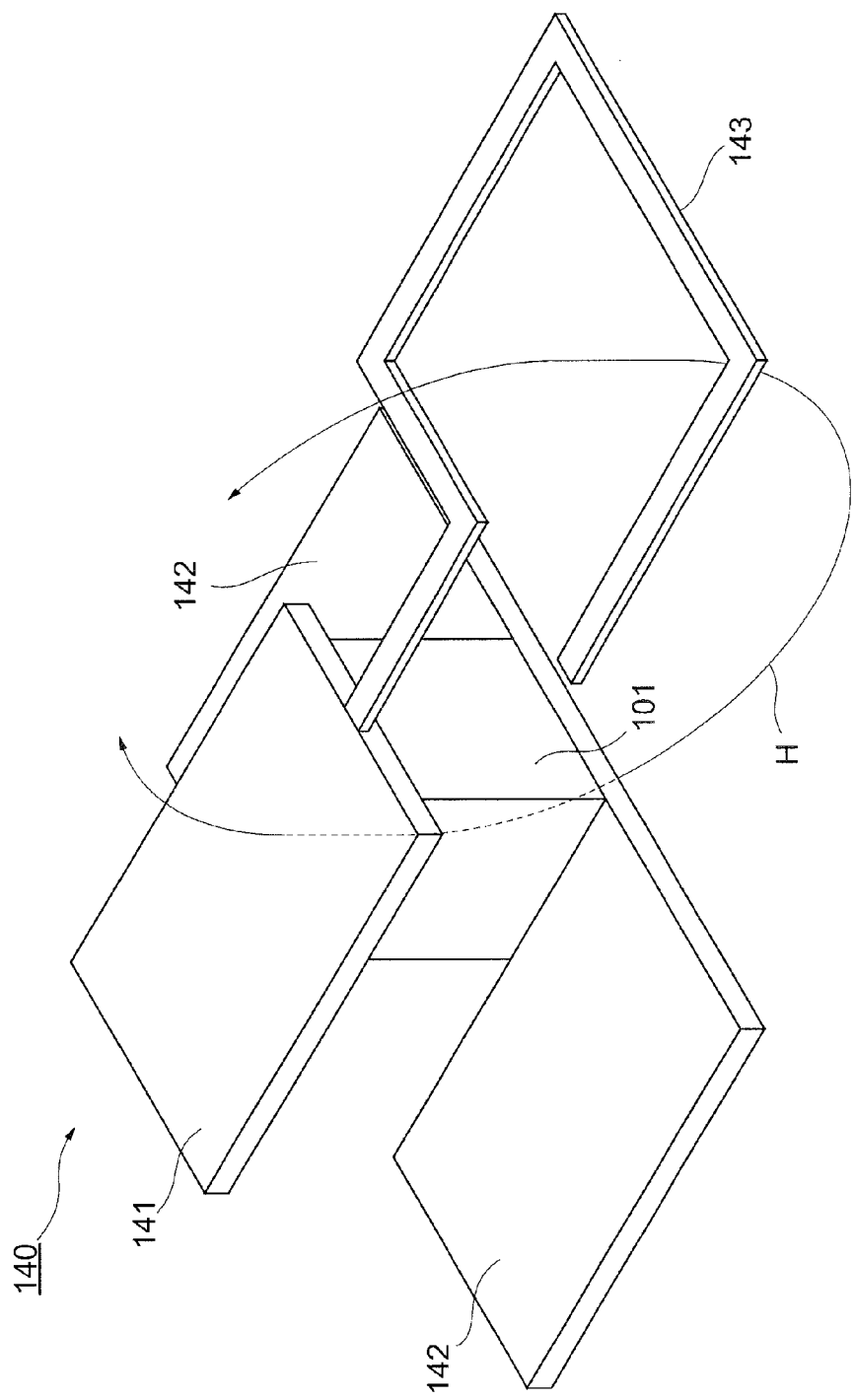
FIG. 6 is a schematic view of an oscillator related to embodiment 3 of this invention.

FIG. 6 is a diagram showing an oscillator of embodiment 3. An oscillator 140 of embodiment 3 is constituted by an oscillation portion 101, a signal line 141 that supplies a current to the oscillation portion 101, a ground line 142, and a loop portion 143. An undepicted stray capacitance exists between the loop portion 143 and the ground line 142. The loop portion 143 is formed so as to extend from the signal line 141. Here, as an example, a structure is shown in which a plane of an opening of the loop portion 143 is on the same plane as a surface of the signal line 141.

If embodiment 3 is shown by an equivalent circuit, the loop portion 143 corresponds to the inductor 131 of FIG. 5, the stray capacitance corresponds to the capacitor 132 of FIG. 5, and the equivalent circuit of embodiment 3 is the same as the circuit 130 shown in FIG. 5.

The loop portion 143 can be formed very close to the oscillation portion 101, so the oscillating magnetic field generated by the loop portion 143 can be effectively fed back to the oscillation portion 101. Thus, output stability of the oscillation portion 101 improves. The structure of embodiment 3 is more preferable in a case in which an oscillation portion is used that efficiently oscillates due to the direction of the magnetic field H generated by the loop portion 143 at a position of the oscillation portion 101 and a direction of a current that flows through the oscillation portion 101 being substantially the same.

The loop portion 143 has one coil in the drawing, but can have two coils or more. Additionally, if the loop portion has two coils or more, the loop portion can be formed on the same plane or can be formed in a helical shape, which is not on the same plane.

(Embodiment 4)

In embodiment 3 it was explained that the loop portion 143 is formed in the first electric circuit 103 and that an oscillating magnetic field generated by the loop portion 143 can be efficiently fed back to the oscillation portion 101, but the direction of the plane of the opening of the loop portion 143 is not limited to the structure shown in FIG. 6. Embodiment 4 shows an embodiment of an oscillator in which the direction of the plane of the opening of the loop portion is changed with respect to embodiment 3.

Figure 7:
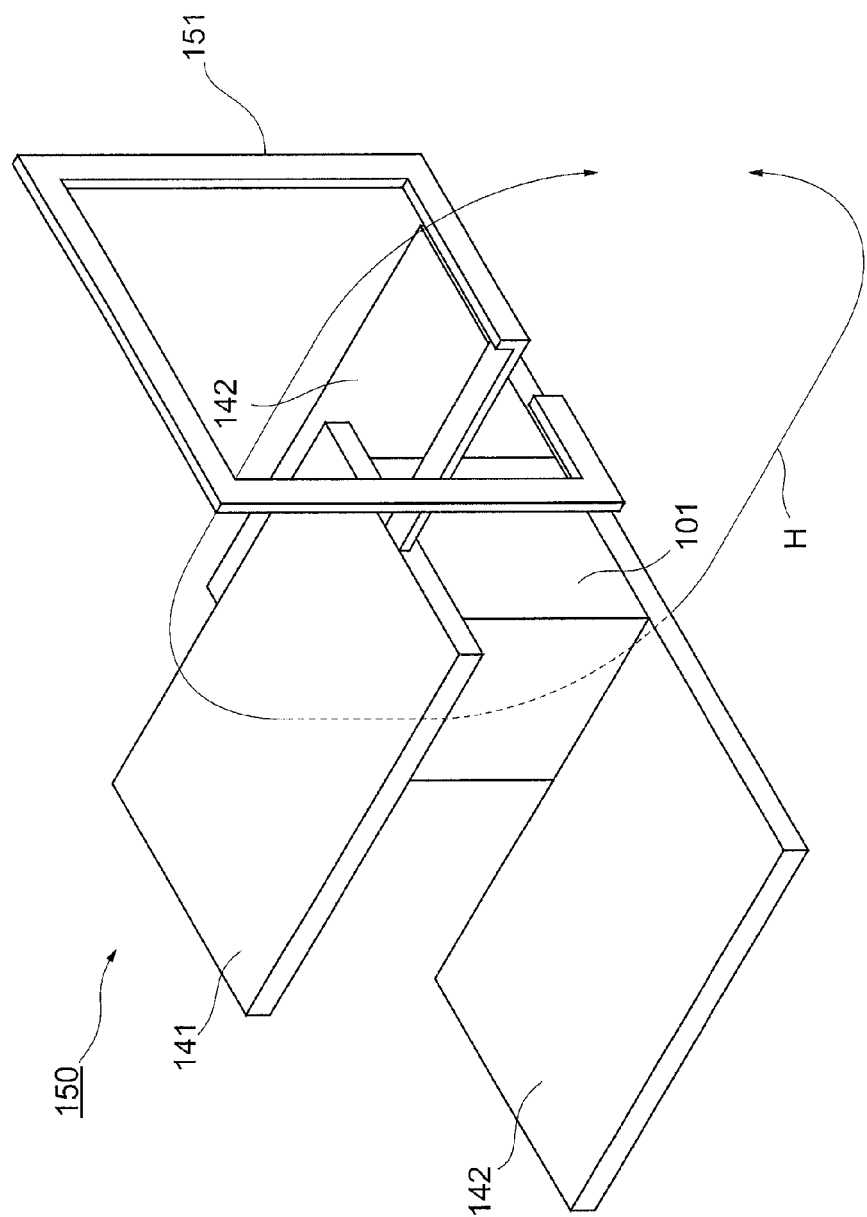
FIG. 7 is a schematic view of an oscillator related to embodiment 4 of this invention.

FIG. 7 shows a schematic view of an oscillator of embodiment 4 in which the direction of the plane of the opening of the loop portion is changed. An oscillator 150 of embodiment 4 is constituted by an oscillation portion 101, a signal line 141 that supplies a current to the oscillation portion 101, a ground line 142, and a loop portion 151. An undepicted stray capacitance exists between the loop portion 151 and the ground line 142. The loop portion 151 is formed so as to extend from the signal line 141, perpendicularly to a plane in which the signal line 141 exists.

If embodiment 4 is shown by an equivalent circuit, the loop portion 151 corresponds to the inductor 131 of FIG. 5, the stray capacitance corresponds to the capacitor 132 of FIG. 5, and the equivalent circuit of embodiment 4 is the same as 130 shown in FIG. 5.

In the oscillator 150 of embodiment 4, the loop portion 151 can be formed very close to the oscillation portion 101, so the oscillating magnetic field generated by the loop portion 151 can be efficiently fed back to the oscillation portion 101. Thus, output stability of the oscillation portion 101 improves.

The structure of embodiment 4 is more preferable in a case in which an oscillation portion is used that efficiently oscillates by having (i) the direction of the magnetic field H generated by the loop portion 143 at a position of the oscillation portion 101 and (ii) a direction of a current that flows through the oscillation portion 101 substantially perpendicular to each other.

The loop portion 151 has one coil in the drawing, but can have two coils or more. Additionally, if the loop portion has two coils or more, the loop portion can be formed on the same plane or can be formed in a helical shape, which is not on the same plane.

In embodiments 3 and 4, a structure is shown in which the plane of the opening of the loop portion 151 is perpendicular or parallel to the plane of the signal line 141, but the angle relationship between the plane of the opening and the plane of the signal line 141 is not limited to this.

(Embodiment 5)

In embodiments 3 and 4, the oscillation portion 101 is arranged outside of the loop portion. In embodiment 5, the oscillation portion 101 is arranged inside of the loop portion.

Figure 8:
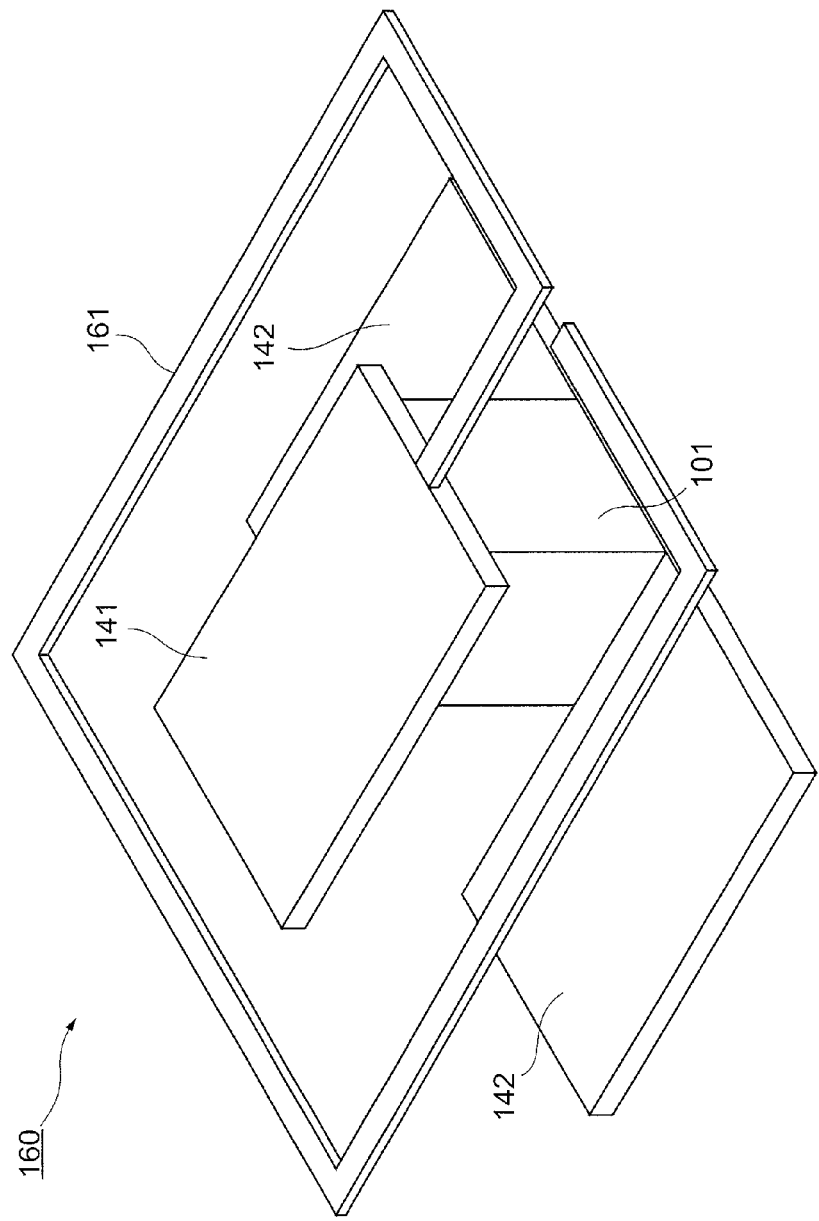
FIG. 8 is a schematic view of an oscillator related to embodiment 5 of this invention.

FIG. 8 shows embodiment 5 in which an oscillation portion is arranged inside of a loop portion. An oscillator 160 is constituted by an oscillation portion 101, a signal line 141 that supplies a current to the oscillation portion 101, a ground line 142, and a loop portion 161. An undepicted stray capacitance exists between the loop portion 161 and the ground line 142. The loop portion 161 has a structure that surrounds the oscillation portion 101 inside and is formed so that the signal line 141 extends therefrom.

If embodiment 5 is shown by an equivalent circuit, the loop portion 161 corresponds to the inductor 131 of FIG. 5, the stray capacitance corresponds to the capacitor 132 of FIG. 5, and the equivalent circuit of embodiment 5 is the same as the circuit 130 shown in FIG. 5.

The loop portion 161 has one coil (loop) in the drawing, but can have two coils or more. Additionally, if the loop portion has two coils or more, the loop portion can be formed on the same plane or can be formed in a helical shape, which is not on the same plane.

The loop portion 161 efficiently generates the oscillating magnetic field H from the output generated by the oscillation portion 101. Furthermore, because the oscillation portion 101 is arranged in the vicinity of the center of the loop portion, which has an oscillating magnetic field H with a large strength, the feedback to the oscillation portion 101 becomes stronger. Thus, in embodiment 5, output stability of the oscillation portion 101 can be further improved.

(Embodiment 6)

In embodiments 2 to 5, embodiments were described in which the stray capacitance is formed at one side of the loop portion. In embodiment 6, a mode is described in which a stray capacitance is not formed at one side of the loop portion, but there is a direct-current connection.

Figure 9:
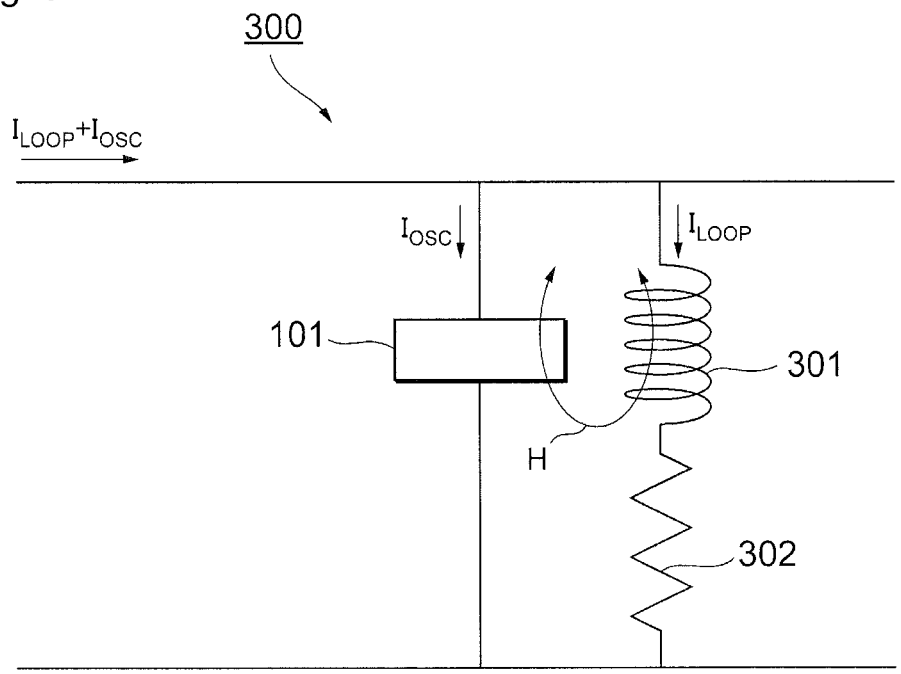
FIG. 9 is a circuit diagram of an oscillator related to embodiment 6 of this invention.

FIG. 9 is a circuit diagram showing embodiment 6, in which a loop portion is formed in direct-current parallel to the oscillation portion. An oscillator 300 is provided with an oscillation portion 101 and a loop portion that is connected in direct-current parallel to the oscillation portion 101. The loop portion is shown as an inductor 301 and a resistor 302.

The loop portion generates an oscillating magnetic field H from the output generated by the oscillation portion 101 and efficiently feeds back the oscillating magnetic field H to the oscillation portion 101, so output stability of the oscillation portion 101 can be improved.

Furthermore, in embodiment 6, the oscillation portion 101 can also be protected from an excessive current. When a current is supplied to the oscillator 300, according to the following equation (1), a current $I_{osc}$ flows to the oscillation portion 101, and a current $I_{Loop}$ flows to the inductor 301.

$$I_{Loop}/I_{osc} = R_{osc}/R_{Loop} \quad (1)$$

Here, a resistance value of the resistor 302 was $R_{Loop}$, and a resistance value of the oscillation portion 101 was $R_{osc}$. In embodiment 6, in order to suppress a large current from flowing to the oscillation portion 101 due to this shunting effect, the oscillation portion 101 can be protected from an excessive current.

(Embodiment 7)

In embodiments 1 to 6, embodiments were described in which that an output generated by the oscillation portion is directly input to a circuit, and the oscillating magnetic field generated by the circuit is fed back to the oscillation portion. In embodiment 7, in order to improve output stability of oscillation, a current amplifying portion is used.

Figure 10:
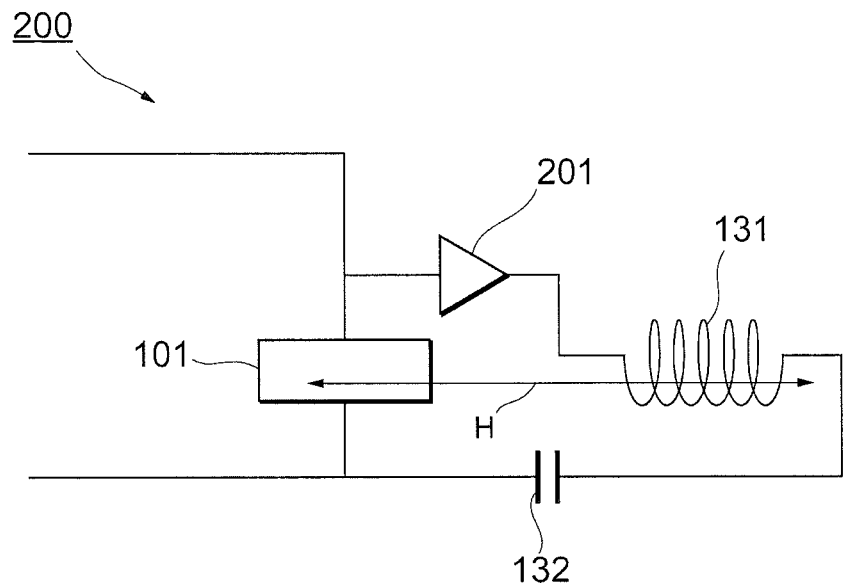
FIG. 10 is a circuit diagram of an oscillator related to embodiment 7 of this invention.

FIG. 10 is a diagram showing embodiment 7, which uses a current amplifying portion for the first electric circuit. An oscillator 200 of embodiment 7 is constituted such that a current amplifying portion 201 and a loop portion that are connected in series are connected in parallel to an oscillation portion 101. The loop portion is shown by the inductor 131 and the capacitor 132. The current amplifying portion 201 has an input end and an output end, and amplifies a current that has been input from the input end and outputs it to the output end. The oscillation portion 101 is connected to the input end of the current amplifying portion 201, and the loop portion is connected in series to the output end of the current amplifying portion 201.

The oscillation portion 101 inputs the generated output to the current amplifying portion 201, and the current amplifying portion 201 supplies an amplified oscillating current to the loop portion. The loop portion feeds back to the oscillation portion 101 an oscillating magnetic field that has been made large by the amplified oscillating current. Thus, the oscillator 200 can further improve output stability of the oscillation.

As explained in embodiment 6, for the loop portion, a mode can also be used in which the capacitor 132 is replaced with the resistor 302.

In the above-mentioned embodiment of an oscillator, a mode is explained in which a loop portion is used as a magnetic field applying portion, but the magnetic field applying portion is not limited to a loop portion. For example, the magnetic field applying portion may be formed in other shapes such as a semicircle-wound shape, which does not completely form a loop, or another shape such as a line or a curve.

(Embodiment 8)

Figure 11:
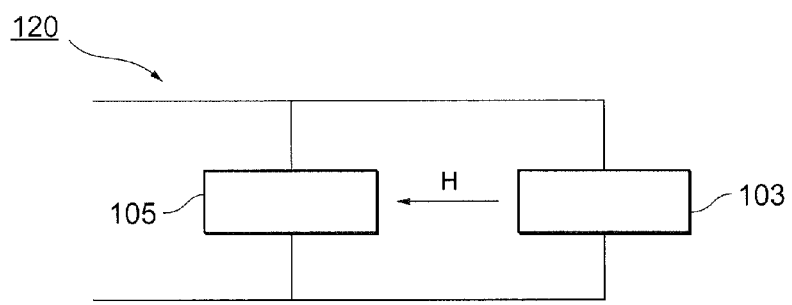
FIG. 11 is a schematic view of a rectifier related to embodiment 8 of this invention.

FIG. 11 is a diagram showing a rectifier 120 related to embodiment 8. The rectifier 120 is provided with (i) a first electric circuit 103 and (ii) a magnetoresistive effect element that is a rectifying portion. Embodiment 8 corresponds to a case in which the oscillation portion 101 of embodiment 1 is replaced with a rectifying portion using the magnetoresistive effect element 105.

When an alternating current is supplied to the rectifier 120 from outside, the alternating current is supplied to the magnetoresistive effect element 105 and the first electric circuit 103. The first electric circuit 103 applies an oscillating magnetic field H to the magnetoresistive effect element 105. Arrow H shows the oscillating magnetic field, which is applied to the magnetoresistive effect element 105, and which is generated by the first electric circuit 103. When the magnetoresistive effect element 105 is supplied with the alternating current, the alternating current is converted to a direct current due to a spin torque FMR (Ferromagnetic Resonance) effect, which will be described later. That is, embodiment 8 becomes a rectifier.

Here, the spin torque FMR effect will be explained. A case will be considered in which the alternating current is applied to the magnetoresistive effect element 105 in a direction perpendicular to the plane of each layer. If the electron 108 is injected from the pin layer 106a to the free layer 106b at an alternating half cycle, the magnetization direction of the free layer 106b rotates such that the magnetization of the free layer 106b and the magnetization of the pin layer 106a become parallel to each other, and the resistance value of the magnetoresistive effect element 105 decreases. Conversely, at a half cycle in which the electron 108 is injected from the free layer 106b to the pin layer 106a, the magnetization direction of the free layer rotates such that the magnetization direction of the free layer 106b and the magnetization direction of the pin layer 106a are antiparallel to each other, and the resistance value increases. Due to the alternating current, this phenomenon of resistance change occurs alternatingly, and a direct current voltage component is generated along with an oscillation voltage. That is, a rectifying action is shown in which an alternating current is converted to a direct current. This is called a spin torque FMR effect. Because the frequency at which the spin torque FMR effect is generated, that is, the rectifying frequency, depends on the applied magnetic field, it is necessary to apply a magnetic field that is sufficient to generate the spin torque FMR effect at a desired frequency.

When the alternating current is supplied to the rectifier 120 from outside, due to the alternating current, the magnetoresistive effect element 105 shows a spin torque FMR effect, using a periodic motion of the magnetization equal to the frequency of the alternating current as a source. Furthermore, the first electric circuit 103 applies, to magnetization, an oscillating magnetic field having a frequency component equal to the frequency of the periodic motion. Thus, the periodic motion of the magnetization becomes stable, and the output stability of the spin torque FMR effect is effectively improved.

As a means of supplying an alternating current to the rectifier 120 from outside, electric power may also be supplied directly to the first electric circuit 103. The means of supplying alternating power to the first electric circuit 103 from the outside is not limited to an alternating current source being connected to the first electric circuit 103. If the first electric circuit 103 has a structure like an antenna, alternating electric power can be supplied from the outside to the first electric circuit 103 by an electromagnetic wave. When the first electric circuit 103 is supplied with alternating electric power from the outside, part of the power is supplied to the magnetoresistive effect element 105, and the first electric circuit 103 applies the oscillating magnetic field H to the magnetoresistive effect element 105. Thus, the rectifier 120 shows a stable rectifying action.

Figure 12:
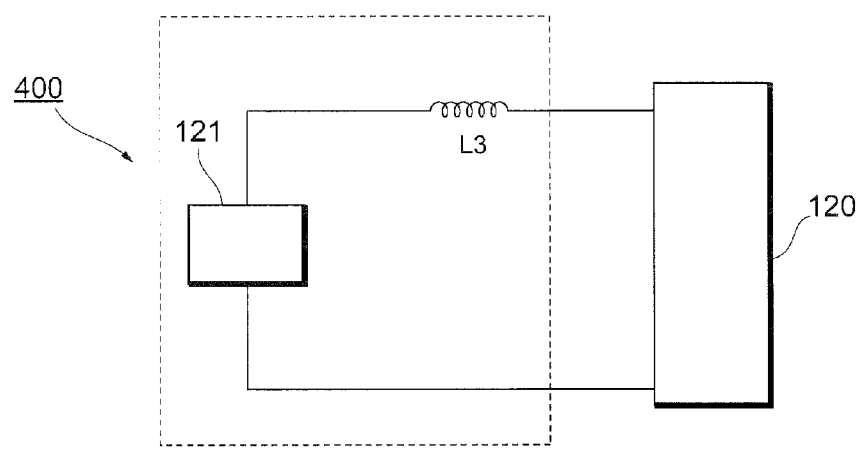
FIG. 12 is a diagram showing a peripheral circuit of the rectifier related to embodiment 8 of this invention.

FIG. 12 is a diagram showing an example of a peripheral circuit using the rectifier 120 related to embodiment 8. A peripheral circuit 400 is constituted by a load 121 and an inductor L3. The inductor L3 can suppress an alternating current from flowing to the load 121.

When alternating electric power is supplied to the first electric circuit 103 of embodiment 8 from the outside, the oscillating magnetic field H is applied to the magnetoresistive effect element 105, and part of the alternating electric power is supplied to the magnetoresistive effect element 105. The magnetoresistive effect element 105 rectifies the alternating current to a direct current, and the rectified direct current voltage is detected by the load 121.

Figure 13:
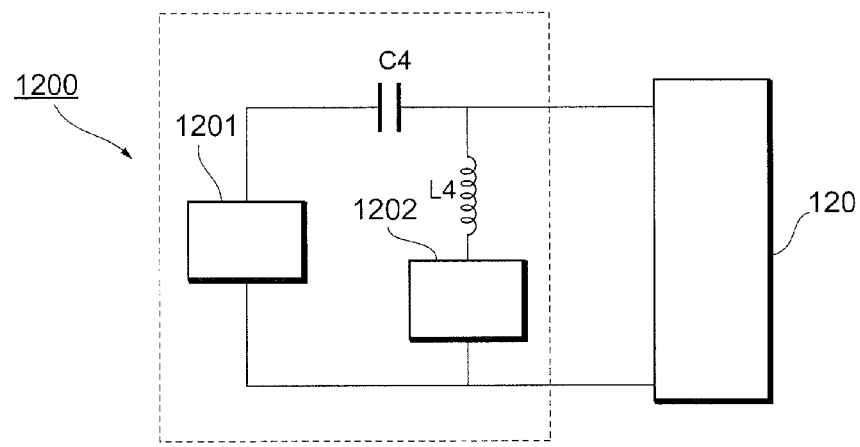
FIG. 13 is a diagram showing the peripheral circuit of the rectifier related to embodiment 8 of this invention.

FIG. 13 is a diagram showing another example of a peripheral circuit using the rectifier 120 related to embodiment 8. A peripheral circuit 1200 is constituted by an alternating current source 1201, a load 1202, an inductor L4, and a capacitor C4. The inductor L4 can suppress an alternating current from flowing to the load 1202, and the capacitor C4 can suppress a direct current generated by the spin torque FMR effect from flowing to the alternating current source 1201.

An alternating current $I_{AC}$ from the alternating current source 1201 is transmitted through the capacitor C4, which has a small impedance, but is mostly not transmitted through the inductor L4, which has a large impedance. Because of this, the alternating current $I_{AC}$ is efficiently supplied to the rectifier 120. The rectifier 120 converts the alternating current to a direct current, and a direct-current output is detected by the load 1202.

A peripheral circuit is omitted in the explanation of the following embodiments.

(Embodiment 9)

In embodiment 9, an example is shown of a case in which the oscillation portion 101 of embodiments 2 to 7 is replaced with a rectifying portion using the magnetoresistive effect element 105. In this case, when an alternating current is applied to each embodiment from the outside, the loop portion applies the oscillating magnetic field H to the magnetoresistive effect element 105 and stabilizes the spin torque FMR effect, and the magnetoresistive effect element 105 rectifies an alternating current to a direct current. That is, each embodiment becomes a rectifier. Because an alternating current and an oscillating magnetic field having the same frequency are applied to the magnetoresistive effect element 105, a more stabilized rectifying action is shown.

As a means of supplying an alternating electric power from the outside to a rectifier in which the oscillation portion 101 of embodiments 2 to 7 is replaced with a rectifying portion using the magnetoresistive effect element 105, electric power can also be directly supplied to the loop portion. For example, the means of supplying alternating electric power from the outside to the loop portion may connect an alternating electric power source to the loop portion. Alternatively, if the loop portion has a structure like an antenna, alternating electric power can be supplied from the outside to the loop portion by an electromagnetic wave. When the loop portion is supplied with alternating electric power from the outside, part of the electric power is supplied to the magnetoresistive effect element 105, and the loop portion applies the oscillating magnetic field H to the magnetoresistive effect element 105. Thus, the rectifier shows a stabilized rectifying action.

(Embodiment 10)

A rectifier using a current amplifying portion is shown in embodiment 10.

Figure 14:
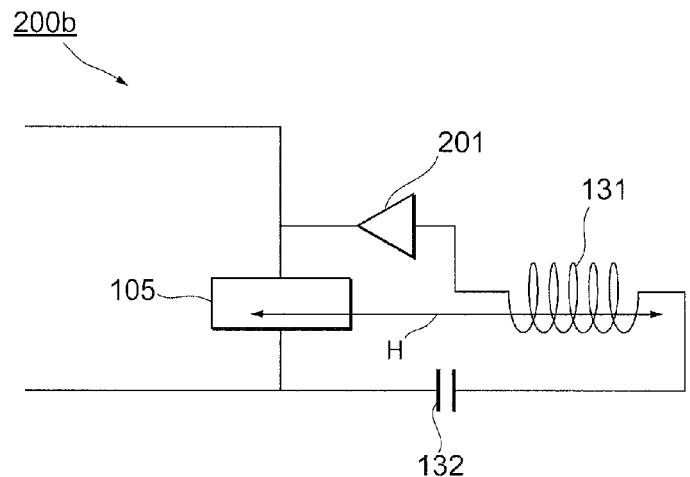
FIG. 14 is a circuit diagram of the rectifier of embodiment 9 of this invention.

FIG. 14 is a diagram showing embodiment 10 of a rectifier using a current amplifying portion. A rectifier 200b of embodiment 10 is constituted such that a current amplifying portion 201 and a loop portion that are connected in series are connected in parallel to a magnetoresistive effect element 105. The loop portion is shown by an inductor 131 and a capacitor 132. The inductor 131 is connected in series to an input end of the current amplifying portion 201, and the magnetoresistive effect element 105 is connected to an output end of the current amplifying portion 201.

When the loop portion receives an electromagnetic wave from the outside, it supplies an alternating current to the current amplifying portion 201. The magnetoresistive effect element 105 is supplied with an amplified alternating current, and an oscillating magnetic field having the same frequency as that of the alternating current is applied to the magnetoresistive effect element 105 by the loop portion. Thus, a more stabilized rectifying action is shown. That is, the rectifier of embodiment 10 becomes a more stabilized rectifier.

A mode can also be used in which, in the loop portion, the capacitor 132 is replaced with the resistor 302 such as is described in embodiment 6.

The loop portion of the rectifier described in embodiments 9 and 10 can also be used as an antenna that receives an electromagnetic field from the outside and supplies electric power to the magnetoresistive effect element 105. Thus, if an electromagnetic field is supplied to the rectifier from the outside, there is no need for newly arranging an antenna, and the rectifier can be made small. Here, antenna refers to antennas that receive electromagnetic waves from a distance sufficiently longer than a wavelength, as well as to antennas and/or resonators that receive electromagnetic fields from a distance that is substantially the same as or smaller than a wavelength.

In the above-mentioned embodiment of the rectifier as well, the magnetic field applying portion is not limited to the loop portion. For example, the magnetic field applying portion may be formed in other shapes such as a semicircle-wound shape, which does not completely form a loop, or another shape such as a line or a curve.

(Embodiment 11)

In embodiment 11, a signal electric power from the outside is applied to the rectifier of embodiments 8 to 10. In that case, the first electric circuit or the loop portion applies a current and an oscillating magnetic field H, which result from the signal electric power, to the magnetoresistive effect element 105, so due to the spin torque FMR effect, the magnetoresistive effect element 105 rectifies a signal current. That is, embodiment 11 becomes a receiver that shows a stabilized receiving action by having a signal current and an oscillating magnetic field of the same frequency applied.

(Embodiment 12)

In embodiment 12, in order to wirelessly transmit an output of the oscillation portion, a means for transmitting an output of the oscillation portion by electromagnetic coupling is arranged in an electric circuit that is direct-current insulated from the oscillator. Inductive coupling due to electromagnetic induction, capacitive coupling, electromagnetic resonance coupling, electromagnetic-wave coupling, or the like are examples of the electromagnetic coupling. In embodiment 12, an embodiment using inductive coupling is explained.

Figure 15:
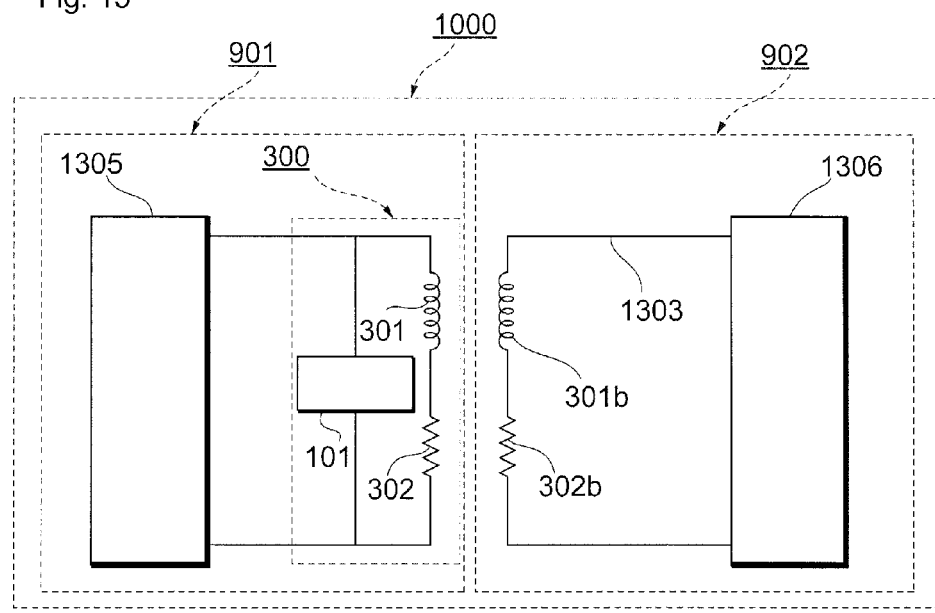
FIG. 15 is a diagram showing a structure of a transceiver device of embodiment 10 of this invention.

FIG. 15 is a circuit diagram of a transmitter 1000 related to embodiment 12. The transmitter 1000 is provided with a first circuit 901 and a second circuit 902. The first circuit 901 is provided with the oscillator 300 of embodiment 6 and a circuit 1305. The loop portion of the oscillator 300 is shown by a first inductor 301 and a resistor 302. The second electric circuit 902 is provided with a conductor 1303 and a circuit 1306. The circuit 1306 is provided with an undepicted antenna that transmits a signal to the outside of the transmitter 1000. The conductor 1303 is provided with a loop portion, which is shown by a second inductor 301b and the resistor 302b. The oscillator 300 and the second electric circuit 902 are direct-current insulated from each other. The first inductor 301 and the second inductor 301b are direct-current insulated from each other, but are inductively coupled.

When the oscillator 300 oscillates, a current that time oscillates flows to the first inductor 301, and a signal from the circuit 1305 is transmitted to the circuit 1306 via the second inductor 301b through inductive coupling.

When impedance matching in the portion with inductive coupling is considered, reflection decreases in the inductive coupling portion. Thus, a signal can be more efficiently transmitted. Impedance of the first circuit 901 is Z1, and impedance of the second circuit 902 is Z2. In order to match the impedance of these two circuits, the numbers of windings in the first inductor 301 and the second inductor 301b are adjusted. This method is known as a method of matching impedance by a transformer. If the number of windings (N1) of the first inductor 301 and the number of windings (N2) of the second inductor 301b are determined so as to satisfy the following equation (2), the impedance of the first circuit 901 and the impedance of the second electric circuit 902 match each other.

$$(N1/N2)^2 = Z1/Z2 \qquad (2)$$

The magnetic field applied to the oscillation portion 101 depends on the number of windings of the inductors. If the number of windings (N1) of the first inductor 301 is adjusted for matching impedance, the magnetic field applied to the oscillation portion 101 changes, so it is desirable that the number of windings (N2) of the second inductor 301b is adjusted.

The loop portion generates the oscillating magnetic field H from the output of the oscillation portion 101, and the oscillating magnetic field H is efficiently fed back to the oscillation portion 101. Thus, an oscillating device is provided in which the output stability of the oscillation portion 101 is improved.

The first inductor 301 and the second inductor 301b can also be constituted such that, for example, iron cores or other magnets are arranged at axial portions of the loop portions. Alternatively, the first inductor 301 and the second inductor 301b can also be arranged in toroidal cores. These structures are preferable when it is desired to strengthen the inductive coupling.

In embodiment 12, an example was described using the oscillator 300 of embodiment 6 as an oscillator, but the oscillator is not particularly limited. For example, oscillators of other embodiments can also be used.

(Embodiment 13)

In embodiment 13, the oscillation portion 101 of embodiment 12 is made to be a rectifier using the magnetoresistive effect element 105. By causing an alternating current to flow to the inductor 301b, the inductively coupled first inductor 301 applies a magnetic field to the magnetoresistive effect element 105, and applies an alternating current to the magnetoresistive effect element 105. In this case, the magnetoresistive effect element 105 functions as an element that rectifies the alternating current to a direct current due to the spin torque FMR effect. Furthermore, by applying an alternating current and an oscillating magnetic field having the same frequency, a more stabilized rectifying action is shown. Therefore, in this case, it becomes a rectifying device.

Embodiment 12 was described using the oscillator 300, but a rectifying device can be constituted by using a rectifying portion in which the oscillation portion 101 of oscillators of other embodiments is replaced by the magnetoresistive effect element 105. That is, a rectifying device can be constituted by using the rectifier described in embodiments 8 to 10. As for an electromagnetic coupling means, for example, inductive coupling due to electromagnetic induction, capacitive coupling, electromagnetic resonance coupling, electromagnetic-wave coupling, or the like can be used. The first electric circuit 103 or the loop portion applies an oscillating magnetic field H to the magnetoresistive effect element 105, and the magnetoresistive effect element 105 rectifies an alternating current by the spin torque FMR effect. The embodiment in that case becomes a rectifying device showing a more stable rectifying action by applying a signal current and a magnetic field having the same frequency.

(Embodiment 14)

In embodiment 14, in the rectifying device described in embodiment 13, by causing a signal current to flow to the inductor 301b, a magnetic field and a current generated by electromagnetic coupling are applied to the magnetoresistive effect element 105. In this case, the magnetoresistive effect element 105 rectifies a signal current into a direct current due to the spin torque FMR effect and receives it, so embodiment 14 becomes a receiving device. Here, electromagnetic coupling means inductive coupling due to electromagnetic induction, capacitive coupling, electromagnetic resonance coupling, electromagnetic-wave coupling, or the like, but is not limited to these. Furthermore, the magnetoresistive effect element 105 shows a more stable receiving action because a current and an oscillating magnetic field that have the same frequency are applied.

(Embodiment 15)

In embodiment 15, a conductor that applies a magnetic field to the oscillation portion 101 is used as a communication antenna.

Figure 16:
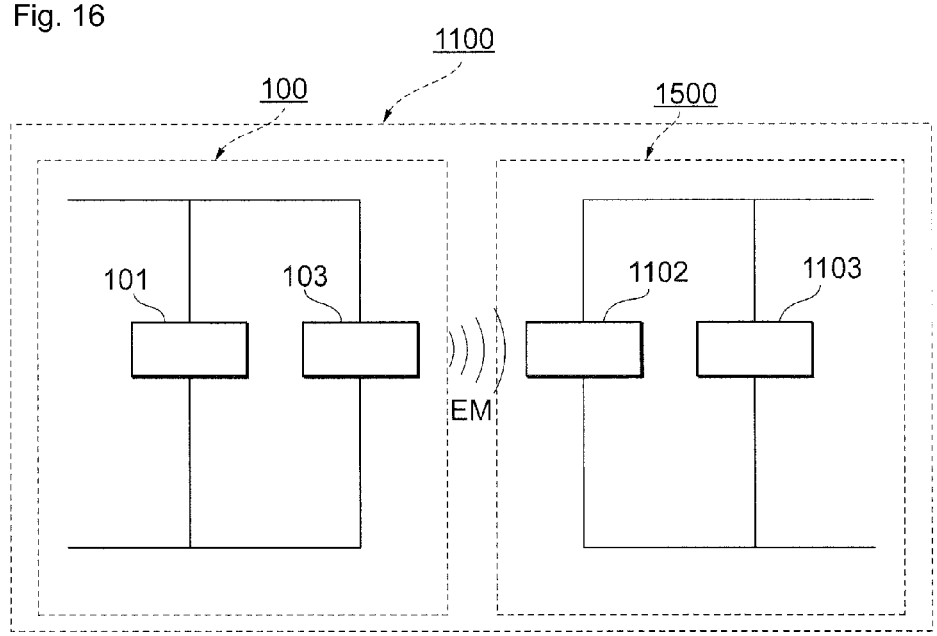
FIG. 16 is a diagram showing a structure of a transceiver device of embodiment 11 of this invention.

FIG. 16 is a diagram showing a transceiver device related to embodiment 15. A transceiver device 1100 of embodiment 15 is constituted by the oscillator 100 of embodiment 1 and a receiver 1500. The oscillator 100 is constituted by an oscillation portion 101 and a first electric circuit 103 connected in parallel to the oscillation portion 101. The receiver 1500 is constituted by (i) an electric circuit 1102 having a means that receives an electromagnetic field generated by the first electric circuit 103, and (ii) a converter 1103 that converts the electromagnetic field received by the electric circuit 1102 to a receiving signal. The magnetoresistive effect element 105 is used for one or both of the oscillation portion 101 and the converter 1103.

As for transmission between the first electric circuit 103 and the circuit 1102, for example, methods are listed such as (i) an electromagnetic induction method in which two loop portions face each other, (ii) an electromagnetic resonance method, due to LC resonance in which a resonance frequency is determined by the inductance and capacitance, (iii) an electromagnetic resonance method in which a resonance frequency is determined by a line length of a pattern conductor, (iv) coupling by capacitance between conductors.

An operation of the transceiver 1100 will be explained. Here, for the purpose of explanation, NRZ (Non-Return-to-Zero) is used for a communication coding method. NRZ is a coding method in which when a signal is "1", the voltage is not zero, but when a signal is "0", the voltage is zero. However, coding methods that can be used for this invention are not limited to this.

When the signal value is "1", a current is caused to flow to the oscillator 100 for the time interval of "1." The oscillation portion 101 oscillates due to the current, and the first electric circuit 103 feeds back an oscillating magnetic field to the oscillation portion 101. The oscillation portion 101 stabilizes and oscillates, and an electromagnetic field EM is transmitted to the circuit 1102 from the first electric circuit 103. The electromagnetic field EM received by the circuit 1102 is converted to a receiving signal in the converter 1103, and the signal value "1" is transmitted.

When the signal value is "0", a current is not caused to flow to the oscillator 100, so an electromagnetic field is not transmitted to the receiver 1500. That is, the signal value "0" is transmitted.

The magnetoresistive effect element 105 is used for the converter 1103. When a high frequency output oscillated by the oscillation portion 101 at the time interval of the signal value "1" is input to the magnetoresistive effect element 105 via the first electric circuit 103 and the circuit 1102, the magnetoresistive effect element 105 converts the high frequency output to a direct current output due to the spin torque FMR. That is, the signal value "1" that was transmitted as a high frequency output is demodulated.

The magnetoresistive effect element 105 can be used for the converter 1103, and the first electric circuit 103 can be used for the circuit 1102. In this case, the magnetic field of the first electric circuit 103 is applied to the magnetoresistive effect element 105, so the receiver 1500 becomes a stable receiver. Thus, the oscillator 100 of embodiment 1 is used for an oscillator, and the receiver of embodiment 11 is used for a receiver. Alternatively, a different structure can be used in which the oscillators of other embodiments and the receiver of embodiment 11 are used in the same structure.

By arranging the oscillation portion 101 and the magnetoresistive effect element 105 so as to be able to feed back an oscillating magnetic field generated by the first electric circuit 103 and the circuit 1102, more stable transmission and receiving can be achieved.

In this embodiment, the first electric circuit 103 that is arranged so as to feed back a magnetic field to the oscillation portion 101 is used as an antenna for wireless transmission. Thus, there is no need for newly arranging an antenna for wireless transmission, and the transceiver device can be made smaller. Here, antenna refers to antennas for communication between distances sufficiently longer than a wavelength, as well as antennas and/or resonators and other wireless transmitters for communication between distances that are substantially the same as or shorter than a wavelength.

Additionally, if the signal value is "0", a current does not flow to the oscillator 100, so an electromagnetic field that is unnecessary for communication is not generated. That is, in this embodiment, effects of conservation of electric power and low noise can also be expected.

(Embodiment 16)

Figure 17:
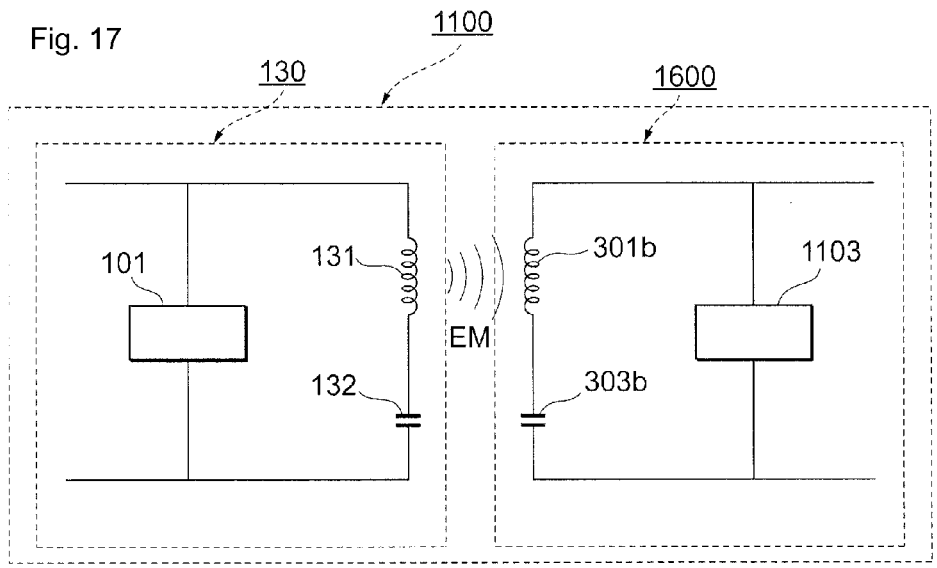
FIG. 17 is a diagram showing a structure of a transceiver device of embodiment 12 of this invention.

In embodiment 16, the oscillator 130 of embodiment 2 is used instead of the oscillator 100 of embodiment 15 (FIG. 16), and furthermore, the same structure as the oscillator 130 on the transmission side is used for the circuit 1102 of embodiment 15. In this case, as shown in FIG. 17, the circuit 103 of embodiment 15 is shown by the inductor 131 and the capacitor 132, and the circuit 1102 of embodiment 15 is shown by the inductor 301b and the capacitor 303b. If the magnetoresistive effect element 105 is used for the oscillation portion 101 and the converter 1103, it becomes a transceiver device using an oscillator and a receiver of the same structure. In this transceiver device, it is also used as an antenna in which a conducting portion that applies a magnetic field is used for wireless transmission.

By arranging the oscillation portion 101 and the magnetoresistive effect element 105 so as to be able to feed back an oscillating magnetic field generated by the inductor 131 and the inductor 301b, more stable transmission and receiving can be achieved.

Because the first electric circuit is constituted by the inductor 131 and the capacitor 132, it is provided with a resonance frequency Fr. Meanwhile, the oscillation portion 101 oscillates at a frequency fr. If the oscillation frequency fr of the oscillation portion and the resonance frequency Fr of the first electric circuit are equal to each other, the first electric circuit resonates at the oscillation frequency fr of the oscillation portion 101. Thus, the oscillating magnetic field of the frequency Fr=fr generated by the first electric circuit can be more efficiently fed back to the oscillation portion 101. Meanwhile, if the oscillating magnetic field of the feedback is excessively strongly, the magnetization of the free layer 106*b* is inverted, which suspends oscillation. In such a case, it is preferable that the oscillating magnetic field strength of the feedback is made weak by using a structure in which the oscillation frequency fr of the oscillation portion and the resonance frequency Fr of the first electric circuit are different from each other. Here, the oscillation frequency fr of the oscillation portion and the resonance frequency Fr of the first electric circuit being equal to each other means that the difference between the oscillation frequency fr of the oscillation portion and the resonance frequency Fr of the first electric circuit is 10% or lower than the oscillation frequency fr of the oscillation portion. Additionally, the oscillation frequency fr of the oscillation portion and the resonance frequency Fr of the first electric circuit being different from each other means that the difference between the oscillation frequency fr of the oscillation portion and the resonance frequency Fr of the first electric circuit is more than 10% of the oscillation frequency fr of the oscillation portion.

(Embodiment 17)

Figure 18:
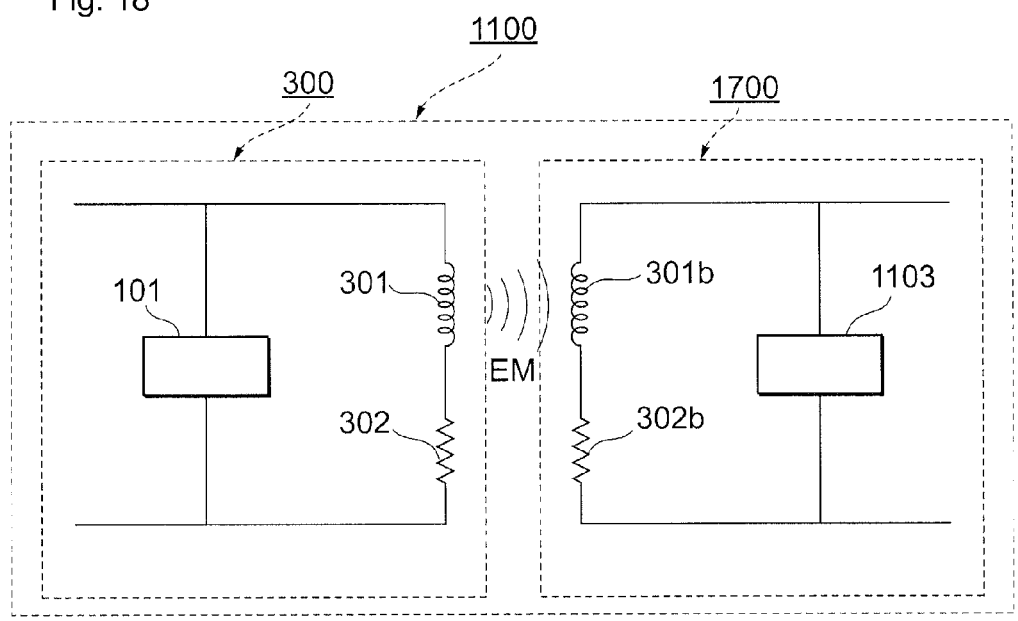
FIG. 18 is a diagram showing a structure of a transceiver device of embodiment 13 of this invention.

In embodiment 17, the oscillator 300 of embodiment 6 is used instead of the oscillator 100 of embodiment 15 (FIG. 16), and furthermore, the same structure as the oscillator 300 on the transmission side is used for the circuit 1102 of embodiment 15. In this case, as shown in FIG. 18, the circuit 103 of embodiment 15 is shown by the inductor 301 and the resistor 302, and the circuit 1102 of embodiment 15 is shown by the inductor 301*b* and the resistor 302*b*. If the magnetoresistive effect element 105 is used for the oscillation portion 101 and the converter 1103, it becomes a transceiver device using an oscillator and a receiver of the same structure. In this transceiver device, it is also used as an antenna in which a conducting portion that applies a magnetic field is used for wireless transmission.

By arranging the oscillation portion 101 and the magnetoresistive effect element 105 so as to be able to feed back an oscillating magnetic field generated by the inductor 301 and the inductor 301*b*, more stable transmission and receiving can be achieved.

In embodiment 17, in order to suppress a large current from flowing to the oscillation portion 101 due to a shunting effect, the oscillation portion 101 can be protected from an excessive current. This is a more preferable mode when it is desired to protect an element from a large current.

In embodiments 16 and 17, cases are explained in which the oscillators of embodiments 3 and 6 are used for the oscillators, but oscillators of other embodiments can also be used. In the receiver as well, receivers other than the one described in embodiment 11 can also be used. In these embodiments, the loop portion or first circuit 103 that feeds back a magnetic field is also used as an antenna for wireless transmission. Thus, there is no need for newly arranging an antenna for wireless transmission, so a transceiver device can be made smaller.

In the above explained embodiments of this invention, a structure can also be used in which a plurality of the oscillation portions 101 or a plurality of the magnetoresistive effect elements 105 are connected in series or parallel, or which uses a combination of these connections.

Embodiments 15 to 17 can be applied to wireless power supply. If an input is maintained in which a signal value is constantly "1", wireless power supply becomes possible.

[Possibility of Industrial Use]

The oscillators, rectifiers, and transceiver devices of this invention can be used for wireless communication, wireless power supply, or the like.

EXPLANATION OF THE SYMBOLS

101 Oscillation portion
102 Current source
103 First electric circuit
105 Magnetoresistive effect element
131 Inductor
132 Capacitor
H Oscillating magnetic field
302 Resistor
303 Capacitor
1500 Receiver
1102 Circuit
1103 Converter

What is claimed is:
1. An oscillator, comprising:
an oscillation portion that generates oscillatory electric signals due to magnetization motion; and
a first electric circuit that is connected in parallel to the oscillation portion, wherein:
a current whose magnitude oscillates flows to the first electric circuit, and
the first electric circuit is arranged such that a magnetic field generated by the current is applied to the oscillation portion.
2. The oscillator as set forth in claim 1, wherein:
the oscillation portion is a magnetoresistive effect element.
3. The oscillator as set forth in claim 2, wherein:
the first electric circuit has a loop portion, and
the loop portion is arranged such that the magnetic field generated by the current flowing through the loop portion is applied to the oscillation portion.
4. The oscillator as set forth in claim 2, wherein:
an oscillation frequency of the oscillation portion and a resonance frequency of the first electric circuit are equal to each other.
5. The oscillator as set forth in claim 2, wherein:
an oscillation frequency of the oscillation portion and a resonance frequency of the first electric circuit are different from each other.
6. The oscillator as set forth in claim 1, wherein:
the first electric circuit has a loop portion, and
the loop portion is arranged such that the magnetic field generated by the current flowing through the loop portion is applied to the oscillation portion.
7. The oscillator as set forth in claim 1, wherein:
an oscillation frequency of the oscillation portion and a resonance frequency of the first electric circuit are equal to each other.
8. The oscillator as set forth in claim 1, wherein:
an oscillation frequency of the oscillation portion and a resonance frequency of the first electric circuit are different from each other.
9. A rectifier, comprising:
a rectifying portion that manifests a rectifying action due to a magnetization motion; and
a first electric circuit that is connected in parallel to the rectifying portion, wherein:
a current whose magnitude oscillates flows to the first electric circuit, and the first electric circuit is arranged such that the magnetic field generated by the current is applied to the rectifying portion.

10. The rectifier as set forth in claim 9, wherein:
the rectifying portion is a magnetoresistive effect element.

11. The rectifier as set forth in claim 10, wherein:
the first electric circuit has a loop portion; and
the loop portion is arranged such that the magnetic field generated by the current flowing through the loop portion is applied to the rectifying portion.

12. The rectifier as set forth in claim 10, wherein:
a rectifying frequency of the rectifying portion and a resonance frequency of the first electric circuit are equal to each other.

13. The rectifier as set forth in claim 10, wherein:
a rectifying frequency of the rectifying portion and a resonance frequency of the first electric circuit are different from each other.

14. The rectifier as set forth in claim 9, wherein:
the first electric circuit has a loop portion; and
the loop portion is arranged such that the magnetic field generated by the current flowing through the loop portion is applied to the rectifying portion.

15. The rectifier as set forth in claim 9, wherein:
a rectifying frequency of the rectifying portion and a resonance frequency of the first electric circuit are equal to each other.

16. The rectifier as set forth in claim 9, wherein:
a rectifying frequency of the rectifying portion and a resonance frequency of the first electric circuit are different from each other.

17. A transceiver device, comprising:
the oscillator as set forth in claim 1; and
a rectifier comprising:
  a rectifying portion that manifests a rectifying action due to a magnetization motion; and
  a first electric circuit that is connected in parallel to the rectifying portion, wherein:
    a current whose magnitude oscillates flows to the first electric circuit, and
    the first electric circuit is arranged such that the magnetic field generated by the current is applied to the rectifying portion;
wherein wireless communication or wireless power transmission is performed by electromagnetically coupling the first electric circuit of the oscillator and the first electric circuit of the rectifier.

18. The transceiver device of claim 17, wherein the oscillation portion is a magnetoresistive effect element.

19. The transceiver device of claim 18, wherein the rectifying portion is a magnetoresistive effect element.

20. The transceiver device of claim 17, wherein the rectifying portion is a magnetoresistive effect element.

* * * * *